United States Patent [19]
Ryum et al.

[11] Patent Number: 5,874,347
[45] Date of Patent: Feb. 23, 1999

[54] METHOD FOR FABRICATING FIELD OXIDE ISOLATION REGION FOR SEMICONDUCTOR DEVICES

[75] Inventors: Byung-Ryul Ryum; Tae-Hyeon Han; Soo-Min Lee; Deok-Ho Cho; Jin-Young Kang, all of Daejeon, Rep. of Korea

[73] Assignees: Electronics and Telecommunications Research Institute, Daejeon-shi; Korea Telecommunications Authority, Seoul, both of Rep. of Korea

[21] Appl. No.: 688,283

[22] Filed: Jul. 29, 1996

Related U.S. Application Data

[63] Continuation of Ser. No. 354,868, Dec. 9, 1994, abandoned.

[30] Foreign Application Priority Data

Nov. 23, 1994 [KR] Rep. of Korea ...................... 94-30900

[51] Int. Cl.⁶ .................................................. H01L 21/76
[52] U.S. Cl. ........................................... 438/445; 438/448
[58] Field of Search ............ 437/72, 984; 148/DIG. 85, 148/DIG. 86, DIG. 117; 438/232, 445, 448

[56] References Cited

U.S. PATENT DOCUMENTS

| | | |
|---|---|---|
| 4,657,630 | 4/1987 | Agatsuma . |
| 4,868,136 | 9/1989 | Ravaglia . |
| 5,002,898 | 3/1991 | Fretzinger et al. ..................... 437/72 |
| 5,130,268 | 7/1992 | Liou et al. . |

FOREIGN PATENT DOCUMENTS

| | | |
|---|---|---|
| 0076942 | 4/1983 | European Pat. Off. . |
| 60-38832 | 2/1985 | Japan . |
| 63-300526 | 12/1988 | Japan . |
| 2111304 | 6/1983 | United Kingdom . |

*Primary Examiner*—George Fourson
*Attorney, Agent, or Firm*—Larson & Taylor

[57] ABSTRACT

Disclosed is a device isolating method of a semiconductor device, comprising the steps of sequentially forming a pad oxide film, a polysilicon film and an insulating layer, on a silicon substrate, said insulating layer being composed of a first silicon oxide film, a nitride film and a second silicon oxide film formed sequentially on the polysilicon film; defining active and inactive regions by using a patterned photomask; removing the insulating layer only on the inactive region so as to expose a surface of the polysilicon film; forming a side wall at both edges of the insulating layer on the active region, said side wall being composed of a nitride film; depositing a third silicon oxide film on the surface of the polysilicon film; removing the side wall and etching the substrate to a predetermined depth to form a trench; filling an insulating material into the trench and depositing it up to the second silicon oxide so as to form an insulating film for isolating; simultaneously removing the second silicon oxide film and the silicon oxide film and removing the polysilicon film only the inactive region; performing a thermal oxidation to form a field oxide film on the inactive region; and sequentially removing the isolating layer and the polysilicon film formed on the active region. Because the active region is defined using an insulator-filled shallow trench before performing thermal oxidation, no oxygen is penetrated into the active region during the thermal oxidation, whereby a field oxide film can be formed without occurrence of a Bird's beak.

5 Claims, 6 Drawing Sheets

METHOD FOR FABRICATING FIELD OXIDE ISOLATION REGION FOR SEMICONDUCTOR DEVICES

This application is a continuation of application Ser. No. 08/1354,868 filed Dec. 9, 1994 now abandoned.

BACKGROUND OF THE INVENTION

1. Field of the Invention

The present invention relates to a method for fabricating a semiconductor device, and more particularly to a method for forming a field oxide film of a semiconductor device so as to electrically isolate device elements in the semiconductor device.

2. Description of the Prior Art

Generally, an LOCOS (Local Oxidation of Silicon) technique is very well-known as a device isolating method of a semiconductor device in the art. During the LOCOS process, a Bird's beak is always generated. The Bird's beak means the shape of an oxide material that has penetrated into an active region of a semiconductor device. Because of such a Bird's beak, the width of an active region in the device is substantially shorten in comparison to a pattern of a mask for forming a field oxide film. Occurrence of such a Bird's beak has a seriously bad effect on the fabrication of an ULSI (ultra-large scale integrated) device required for integration of 64 mega or more.

Recently, to reduce a size of a Bird's beak, a PBL (polysilicon buffered LOCOS) method, which uses a polysilicon having a characteristic of a further fast thermal-oxidation in comparison to a single crystal, has been developed.

FIG. 1 shows a partial structure of a semiconductor device which is fabricated by the above-described PBL method. In FIG. 1, a reference numeral 15 indicates a polysilicon layer formed between field oxide regions 19, 19 and located on a silicon substrate 11 with a pad oxide film 13 interposed therebetween. While performing a PBL process, since an oxidation speed of the polysilicon 15 is faster than that of the silicon substrate 11, the polysilicon 15 serves as a protective film to prevent penetration of oxygen into an active region of the silicon substrate 11, whereby enlargement of a Bird's beak can be obstructed.

However, a nitride film 17 formed on the polysilicon 15 is strained due to a stress occurring upon oxidation of the polysilicon 15 being performing, and thus oxygen is penetrated through a gap between the strained nitride film 17 and the polysilicon 15. As a result, a Bird's beak having a width BB is produced as shown in FIG. 1.

FIG. 2 shows another structure of a portion of a semiconductor device which is fabricated by an enhanced PBL method. Similarly, the structure of FIG. 2 has a polysilicon layer 25 between field oxide regions 29, 29 and located on a silicon substrate 21 with a pad oxide film 23 interposed therebetween. To prevent oxygen from being penetrated through a side of the polysilicon 25 and reduce a width of a Bird's beak, after formation of a side nitride film 28 an oxidation is performed. However, as in the PBL method shown in FIG. 1, since it is impossible to completely prevent oxygen from being penetrated through an interface between the side nitride film 28 and the substrate 21, a stress occurs under the side nitride film 28 during oxidation. As a result, a gap in the interface is wide, and thus a Bird's beak is produced by following oxidation, as shown by BB in FIG. 2.

FIGS. 3A and 3B show the structure of a portion of a semiconductor device which is fabricated by a most recently developed PBL method, wherein FIG. 3A is a cross-sectional view of the partial structure of the semiconductor device before performing a thermal oxidation process and FIG. 3B is a cross-sectional view of the partial structure after performing a thermal oxidation process.

As shown in FIGS. 3A and 3B, on a silicon substrate 31 first and second pad oxide films 33, 34 are sequentially formed, and then the second pad oxide film 34 is over-etched by using a patterned nitride film 37 thereon as a mask to form a side groove. Next, a polysilicon layer 35 is deposited over the nitride film 37 including the side groove and is thermal-oxidized to prevent the nitride film 37 from being strained and prevent oxygen from penetrating through the side groove during oxidation.

As described above, to minimize a size of a Bird's beak, prior art methods have been proposed in the art, but such occurrence of a Bird's beak can not be prevented by the prior art methods developed up to now.

SUMMARY OF THE INVENTION

It is an object of the present invention to provide a method for fabricating a semiconductor device in which a field oxide film can be formed without occurrence of a Bird's beak.

According to one aspect of the present invention, the method for fabricating a semiconductor device, comprising the steps of sequentially forming a pad oxide film, a polysilicon film and an insulating layer, on a silicon substrate, said insulating layer being composed of a first silicon oxide film, a nitride film and a second silicon oxide film formed sequentially on the polysilicon film; defining active and inactive regions by using a patterned photomask; removing the insulating layer only on the inactive region so as to expose a surface of the polysilicon film; forming a side wall at both edges of the insulating layer on the active region, said side wall being composed of a nitride film; depositing a third silicon oxide film on the surface of the polysilicon film; removing the side wall and etching the substrate to a predetermined depth to form a trench; filling an insulating material into the trench and depositing it up to the second silicon oxide so as to form an insulating film for isolating; simultaneously removing the second silicon oxide film and the silicon oxide film and removing the polysilicon film only the inactive region; performing a thermal oxidation to form a field oxide film on the inactive region; and sequentially removing the isolating layer and the polysilicon film formed on the active region.

In the method, the method further comprises the step of depositing a polysilicon film on the nitride film and the pad oxide film before performing the thermal oxidation.

In this method, a depth of the trench is set in the range of 5 µm or less, and a width thereof is set 3 µm or less.

In this method, the insulating material filled into the trench is formed of one of BPSG, silicon nitride and polyimide.

According to another aspect of the present invention, the method comprising the steps of sequentially forming a pad oxide film, a first polysilicon film, a silicon oxide film, a nitride film and a second polysilicon film, on a silicon substrate; defining active and inactive regions by using a trench mask and forming a trench at both sides of the active region by etching; filling an insulating material into the trench and depositing on the second polysilicon film to form an insulating film for isolating; polishing the insulating film using the second polysilicon film as a first polishing stopper;

removing the second polysilicon film and polishing the insulating film using the nitride film as a second polishing stopper, removing the nitride film and the silicon oxide film; depositing a protective insulating film only on the active region; removing the first polysilicon film to expose a surface of the pad oxide film; performing a thermal oxidation to form a field oxide film only at the inactive region; and removing the films formed on the pad oxide film of the active region.

In this method, a depth of the trench is set in the range of 5 μm or less, and a width thereof is set 3 μm or less.

In this method, each thickness of the second polysilicon film and the nitride film is determined in accordance with a depth of the trench and a rate of polishing selection of the insulating film for isolating, and wherein the first polysilicon film has a thickness of about 2000 Å and the pad oxide film has a thickness of from 300 to 500 Å.

In this method, the insulating material filled into the trench is formed of one of BPSG, silicon nitride and polyimide.

According to the device isolating method of the present invention, since an active region is defined using an insulator-filled shallow trench before performing thermal oxidation, no oxygen is penetrated into the active region during the thermal oxidation. Therefore, a field oxide film can be formed without occurrence of a Bird's beak.

BRIEF DESCRIPTION OF THE DRAWINGS

This invention may be better understood and its object will become apparent to those skilled in the art by reference to the accompanying drawings as follows:

FIGS. 3A and 3B are cross-sectional view showing a partial structure of a semiconductor device which is fabricated by a further prior art enhanced PBL method, wherein FIG. 3A is a cross-sectional view of the partial structure before performing a thermal oxidation process and FIG. 3B is a cross-sectional view of the partial structure after performing a thermal oxidation process;

FIGS. 5A–5F, 5G, 5G-1, 5G-2 and 5H–5J are cross-sectional-views showing the device isolating method according to one embodiment of the present invention.

DESCRIPTION OF THE PREFERRED EMBODIMENT(S)

Figure 4:
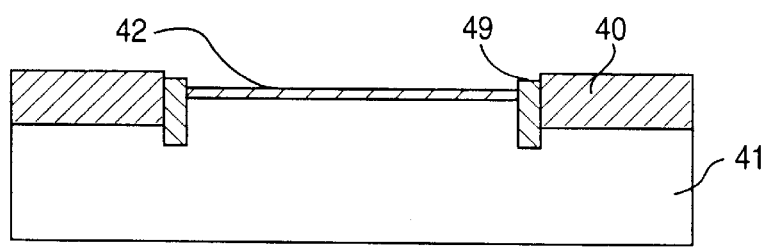
FIG. 4 is a cross-sectional view showing the structure of a portion of a semiconductor device which is fabricated by a device isolating method of the present invention.

FIG. 4 show the structure of a portion of a semiconductor device which is fabricated by the device isolating method of the present invention, and FIGS. 5A to 5J show the processes of the device isolating method of the present invention.

The device made according to the present invention as depicted in FIG. 4 has a silicon substrate 41, a pad oxide film 42 on top of a central part of silicon substrate 41 and which extends between side wall insulating films 49, and field oxide films 40 on top of side parts of silicon substrate 41 which do not have an undesirable Bird's beak formed at the inactive region.

Figure 5A:
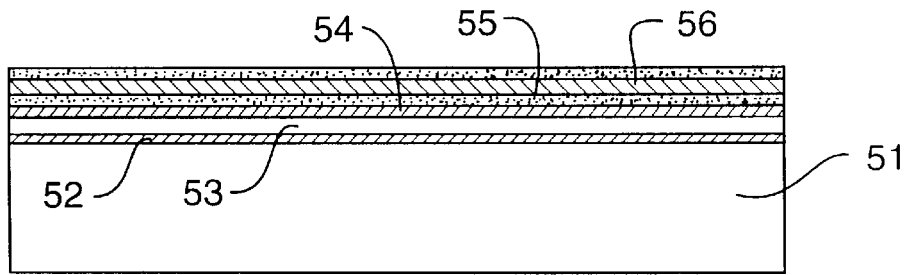

Referring to FIG. 5A, on a silicon substrate 51 several films are sequentially formed. First, a pad oxide film 52 having thickness of from 300 Å to 500 Å is formed on a main surface of the silicon substrate 51 by an oxidation, and then a polysilicon film 53 having thickness of about 2000 Å is deposited on the pad oxide film 52. Next, on the polysilicon film 53, several insulating films, i.e. a first silicon oxide film 54, a nitride film 55 and a second silicon oxide film 56 are sequentially formed.

Figure 5B:
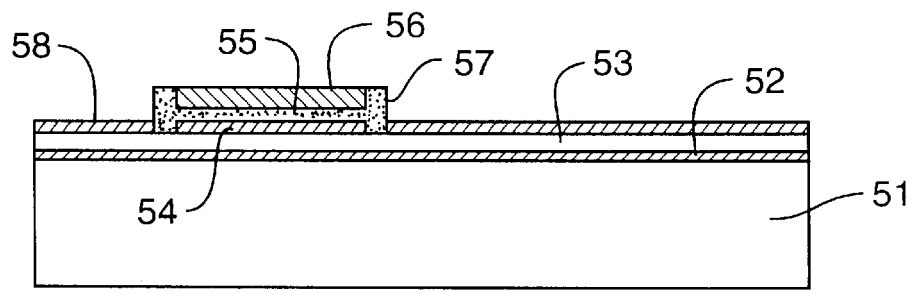

In FIG. 5B, on the second silicon oxide film 56, a patterned photoresist film (not shown) is formed to define active and inactive regions, and then a well-known etching process is performed to remove the insulating films 56, 55, 54 only on the inactive region. After deposition of a nitride film thereon, at both edges of the insulating films 54, 55, 56 formed on the active region, a side wall 57 is formed by an anisotropic etching. Then, a third silicon oxide film 58 is selectively deposited only on an exposed surface of the polysilicon film 53 on the inactive region.

Figure 5C:
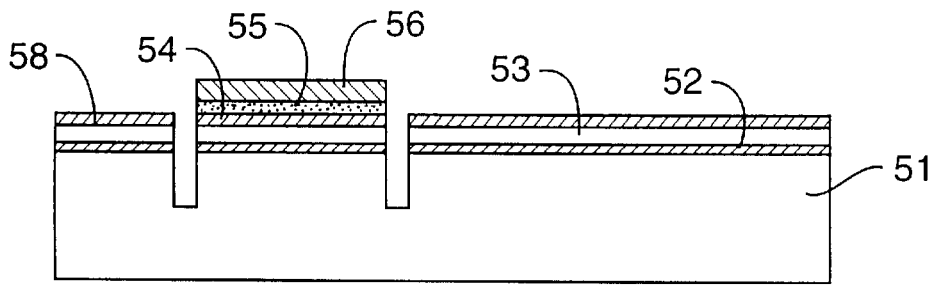

With reference to FIG. 5C, a trench forming process is carried out, whereby a trench is formed. First, after removal of the side wall 57, an etching process is performed using the silicon oxide film 58 and the second silicon oxide film 56 as an etching mask, whereby a trench is formed in the silicon substrate 51 to a predetermined depth. In this embodiment, the width of the trench is substantially determined by the width of the side wall. Also, in this etching process, the depth of the trench can be accurately controlled enough to prevent a Bird's beak from being generated in the following field oxide forming process. The depth of the trench is preferably set in the range of 5 μm or less, and the width thereof is preferably set at 3 μm or less.

Figure 5D:
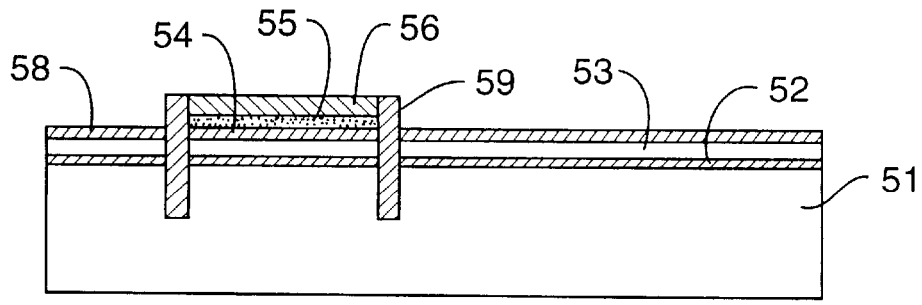

Next, an insulating material is filled into the trench and piled up to the second silicon oxide film 56, thereby obtaining an insulating film 59, as shown in FIG. 5D. As the insulating material, BPSG (Boron Phosphorous Silica Glass), silicon nitride ($Si_3N_4$) or polyimide can be used.

Figure 5E:
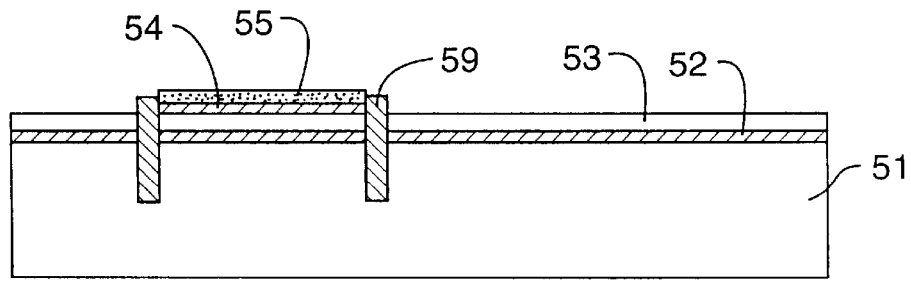

As shown in FIG. 5E, the silicon oxide films 56, 58 are simultaneously removed by a well-known etching process, and at the same time the insulating film 59 is removed to a certain extent, i.e., to the same thickness as the silicon oxide film 56. In this etching process, the nitride film 55 is used as an etching stopper.

Figure 5F:
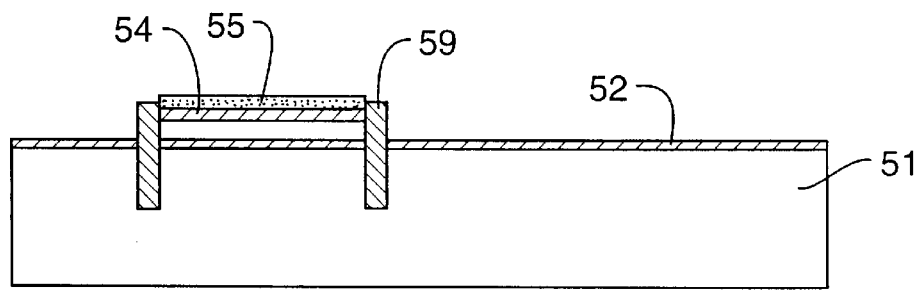

Subsequently, the polysilicon film 53 on the inactive region is selectively removed as shown in FIG. 5F.

Figure 5G:
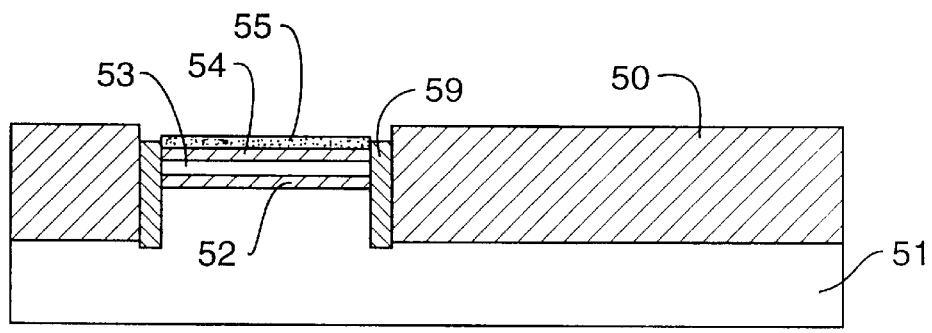
Figures 1, 5G:
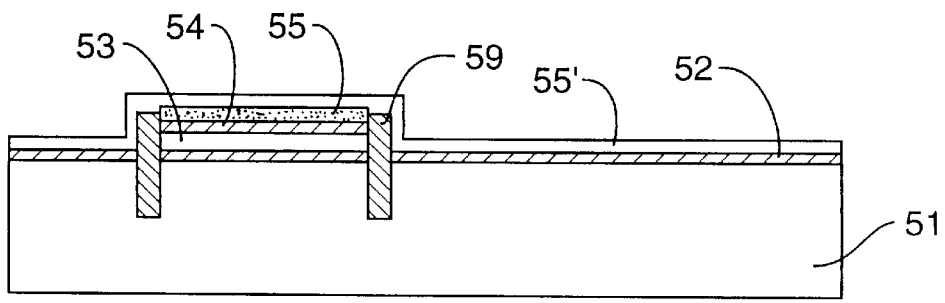
Figures 2, 5G:
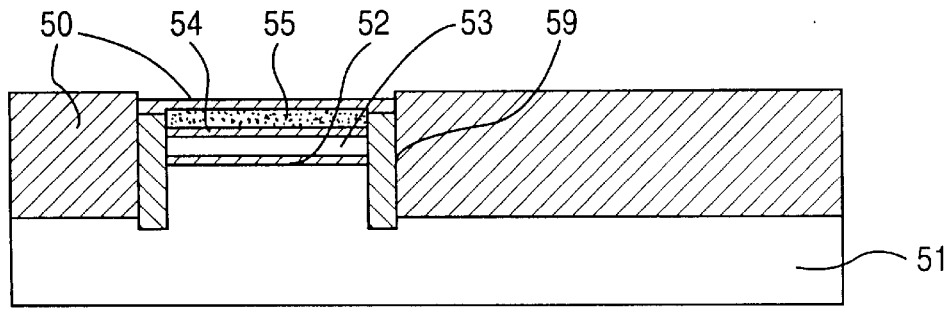

In FIG. 5G, a thermal oxidation process is carried out, whereby a thermal oxide film is formed at the inactive region. Then, since the active region is enclosed with the trench and the nitride film 55 thereon, no oxygen is introduced into the active region. As a result, a field oxide film 50 without a Bird's beak is formed at the inactive region.

Figure 1:
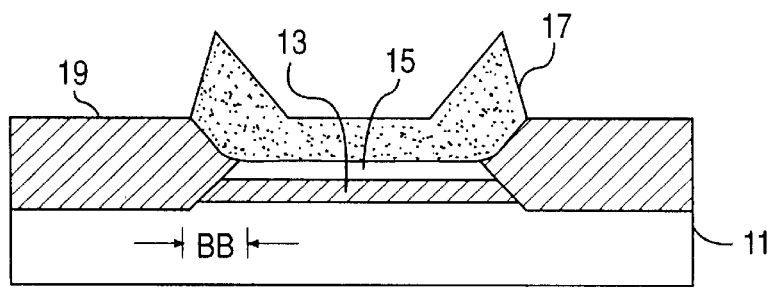
FIG. 1 is a cross-sectional view showing a partial structure of a semiconductor device which is fabricated by a prior art PBL method.
Figure 2:
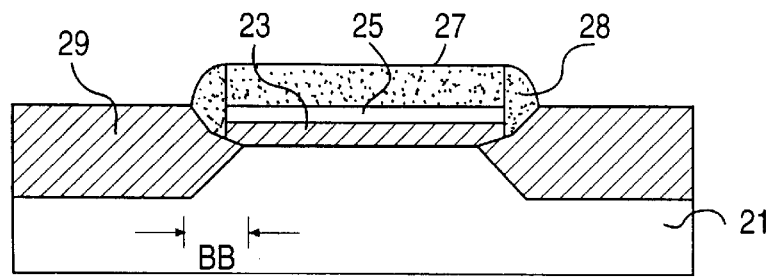
FIG. 2 is a cross-sectional view showing a partial structure of a semiconductor device which is fabricated by another prior art PBL method.
Figure 3A:
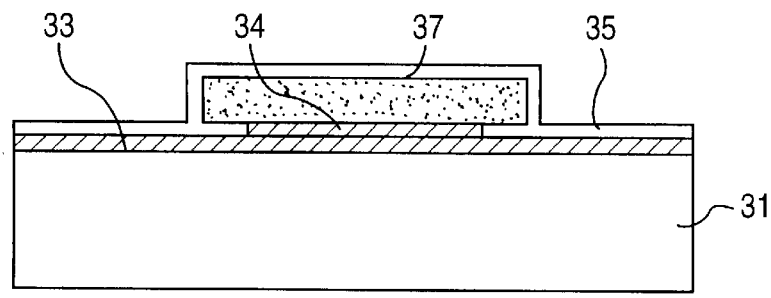
Figure 3B:
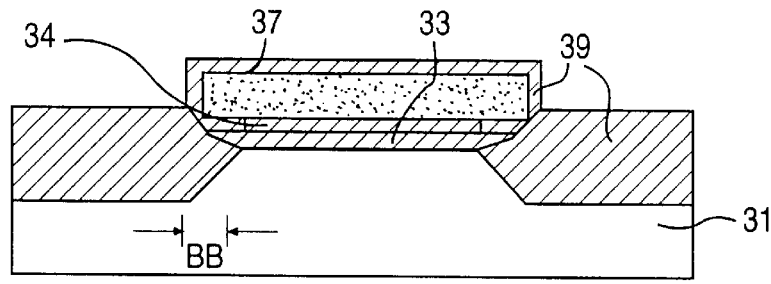

In addition, to utilize a fast oxidation characteristic of polysilicon and prevent the nitride film, 55 from being strained, the method of the present invention further comprises the step of depositing a polysilicon film 55' on the structure of FIG. 5F, as shown in FIG. 5G-1, before performing the thermal oxidation process. With the additional deposition of the polysilicon film 55', it is possible to prevent deformation of the nitride film 55 occurring during thermal oxidation, as shown in FIG. 5G-2.

Figure 5H:
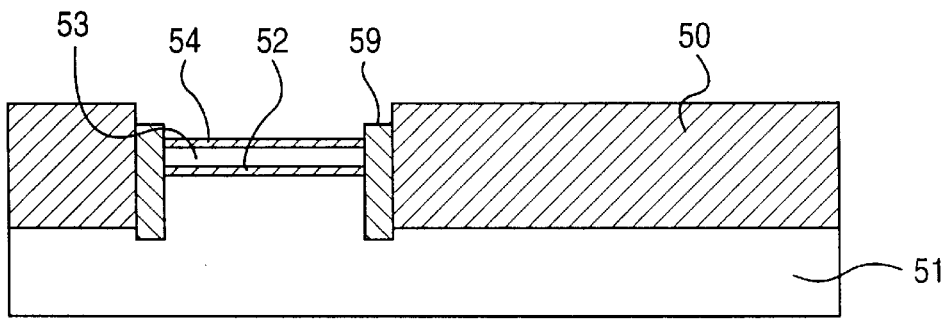
Figure 5I:
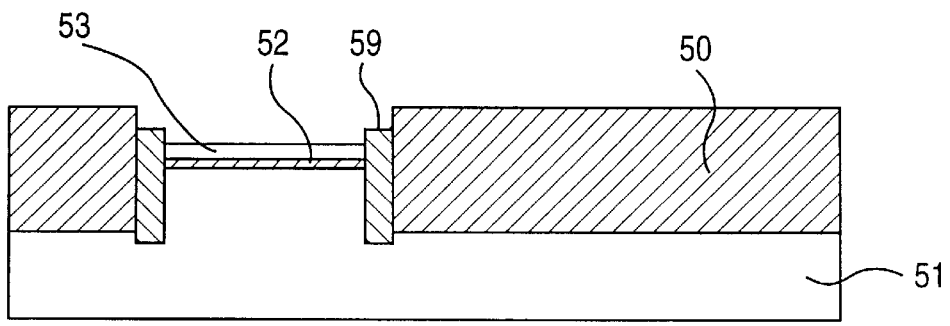
Figure 5J:
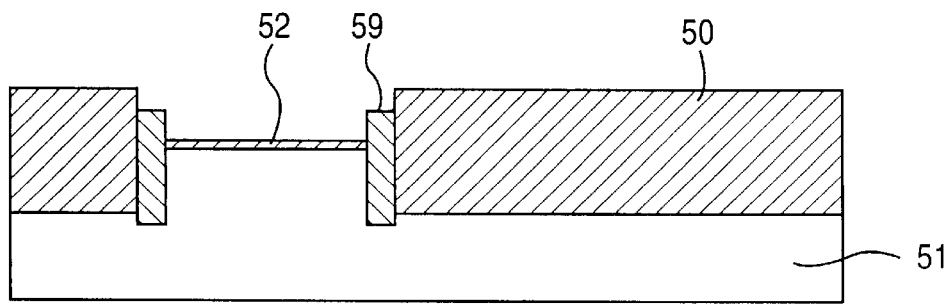

With reference to FIGS. 5H to 5J, all the films 55, 54, 53 which remain on the pad oxide film 52 of the active region are sequentially removed, the active region is completely isolated from the field oxide film 50 by the insulating film 59 filled in the trench.

As described above, in the device isolating method of the embodiment, the active region is defined by using the insulating film 59 filled in the trench.

Hereinafter, the device isolating method according to another embodiment of the present invention will be described with reference to FIGS. 6A to 6H.

Figure 6A:
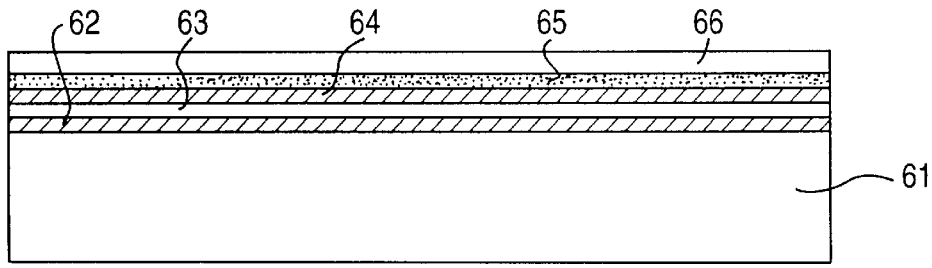
FIGS. 6A to 6H are cross-sectional views showing the device isolating method according to another embodiment of the present invention.

Referring to FIG. 6A, on a silicon substrate 61, several films are sequentially formed. First, a pad oxide film 62 having thickness of from 300 Å to 500 Å is formed on a main surface of the silicon substrate 61 by an oxidation, and then a first polysilicon film 63 having thickness of about 2000 Å is deposited on the pad oxide film 62. Next, on the polysilicon film 63, several films, i.e. a silicon oxide film 64, a nitride film 65 and a second polysilicon film 66 are sequentially formed. The second polysilicon film 66 and the nitride film 55 all are used as a polishing stopper. Thickness of each of the second polysilicon film 66 and the nitride film 55 is determined in consideration with a depth of a trench End a rate of polishing selection of an insulating film for isolating.

Figure 6B:
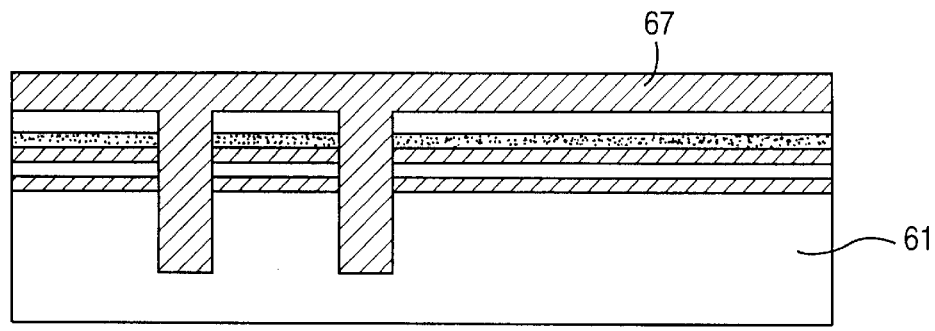

In FIG. 6B, a trench forming process is carried out, whereby a trench is formed. First, after defining an active region byusing a trench isolating mask (not shown), a selective etching process is performed, whereby a trench is formed in the silicon substrate 60. Depth of the trench is determined by the thickness of the films formed on the substrate 60 and the depth of an etched portion of the silicon substrate 60. Preferably, the depth of the trench is set in the range of 5μm or less, and a width thereof is set 3 μm or less. Next, an insulating material is filled into the trench and deposited to the second polysilicon film 66, whereby obtaining an insulating film 69 for isolating, as shown in FIG. 6B.

Figure 6C:
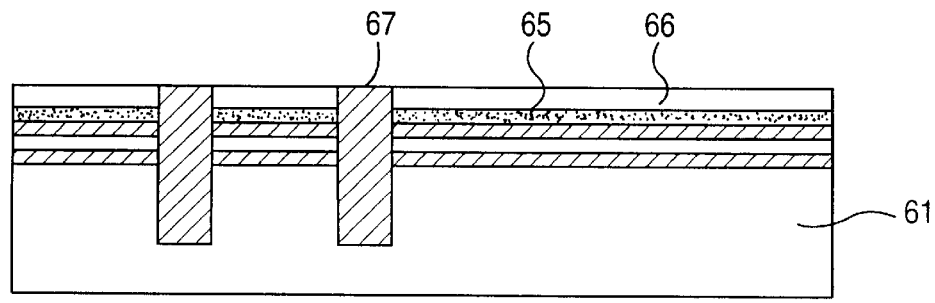

Subsequently, as shown in FIG. 6C, the insulating film 69 is polished by a chemical-mechanical polishing method until a surface of the second polysilicon film 66 is exposed. Then, the second polysilicon film 66 is used as a first polishing stopper.

Figure 6D:
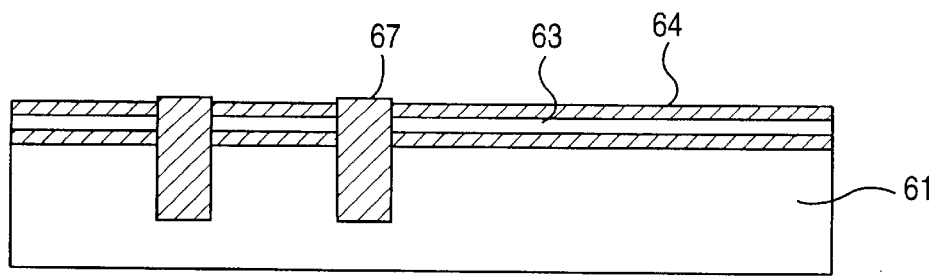

As shown in FIG. 6D, after removing the second polysilicon film 66 by using a dry etching or a wet etching, the insulating film 67 for isolating is also polished by, the polishing method using the nitride film 65 as a second polishing stopper. Next, the nitride film 65 is also removed.

Figure 6E:
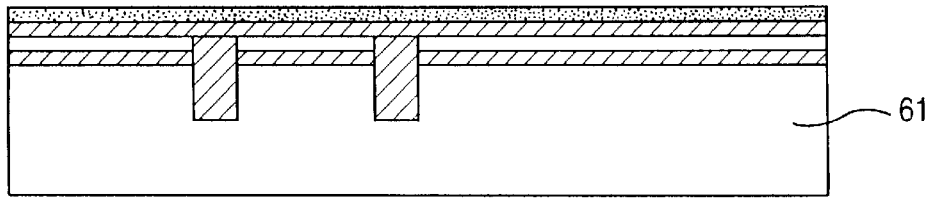
Figure 6F:
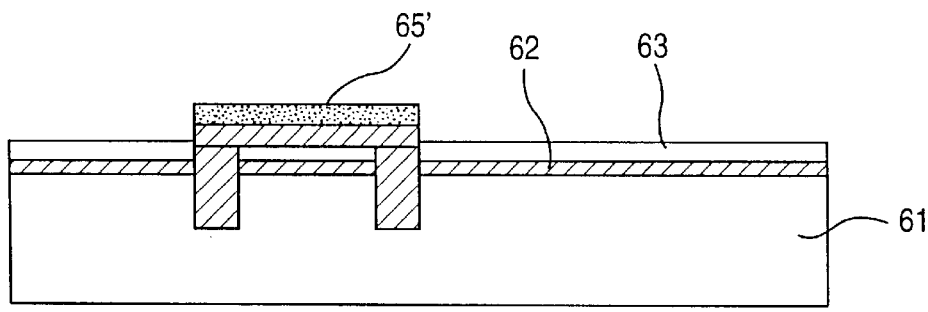

To protect the active region defined by the trench against following thermal oxidation, a nitride film is deposited thereon and patterned, whereby a patterned nitride film 65' is formed only on the active region, as shown in FIG. 6E. Also, an etching process is carried out to remove the silicon oxide film 64 only on an inactive region. As a result, a surface of the first polysilicon film 63 is exposed.

Figure 6G:
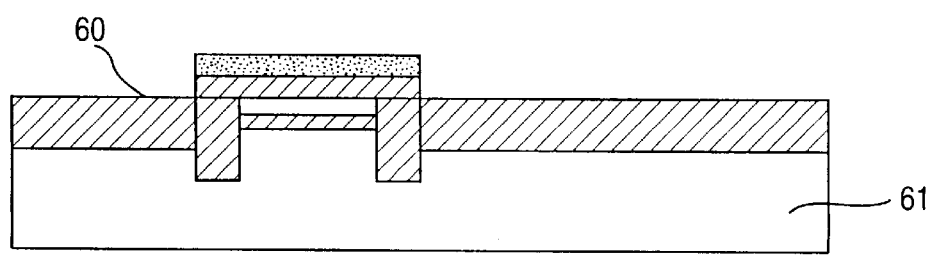

As shown in FIG. 6G, after removal of the first polysilicon film 63 exposed thus, a thermal oxidation process is performed, whereby a thermal oxide film is formed at the inactive region. Similarly, since the active region is enclosed with the trench and the nitride film 65' thereon, no oxygen is introduced into the active region during thermal oxidation, as in the first embodiment. As a result, a field oxide film 60 without a Bird's beak is formed at the inactive region.

Figure 6H:
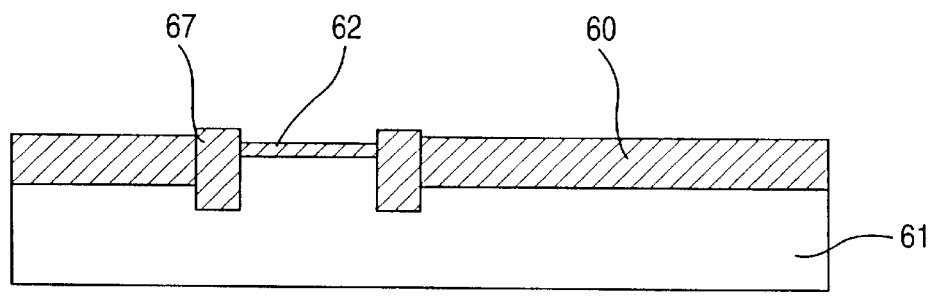

With reference to FIG. 6H, all the films 65', 64, 63 which remain on the pad oxide film 62 of the active region are sequentially removed, the active regions are completely isolated from the field oxide film 60 by the insulating film 67 filled in the trench.

As describe above, according to the device isolating method of the present invention, since an active region is defined using an insulator-filled shallow trench before performing thermal oxidation, no oxygen is penetrated into the active region during the thermal oxidation. Therefore, a field oxide film can be formed without occurrence of a Bird's beak.

In addition, to enhance integration of ICs (integrated circuits), it is necessary to minimize occurrence of a Bird's beak. The method of the present invention is applicable to fabrication of semiconductor devices required for integration of one giga or more.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. A method for fabricating a semiconductor device, the method comprising the steps of:

sequentially forming on a silicon substrate a pad oxide film, a polysilicon film and an insulating layer of a first silicon oxide film, a nitride film and a second silicon oxide film formed sequentially on the polysilicon film;

defining active and inactive regions by using a patterned photomask;

removing the insulating layer only on the inactive region so as to expose a surface of the polysilicon film;

forming a side wall at the resulting edges of the insulating layer on the active region;

depositing a third silicon oxide film on the resulting exposed portion of the surface of the polysilicon film;

removing the side wall and etching the resulting exposed portion of the substrate to form a trench;

filling an insulating material into the trench and depositing the insulating material up to about the level of the second silicon oxide film so as to form an isolating insulating film;

simultaneously removing the second silicon oxide film and the third silicon oxide film and removing the polysilicon film only in the inactive region;

after filling the trench with an insulating material, and after the removal of the second and third oxide films and the part of the polysilicon film in the inactive region, performing a thermal oxidation to form a field oxide film on the inactive region; and sequentially removing the insulating layer and the polysilicon film on the active region.

2. The method as defined in claim 1, wherein further comprising the step of depositing a polysilicon film on the nitride film and the pad oxide film before performing the thermal oxidation step.

3. The method as defined in claim 1, wherein the depth of the trench is set in the range of 5 μm or less, and the width of the trench is 3 μm or less.

4. The method as defined in claim 1, wherein the insulating material filled into the trench is formed of one of BPSG, silicon nitride and polyimide.

5. The method as defined in claim 1, wherein said side wall is a nitride film.

* * * * *